March 12, 1968 D. N. ADAMS ET AL 3,373,021
PRESENSITIZED POSITIVE WORKING LITHOGRAPHIC PLATE
Filed Jan. 29, 1964
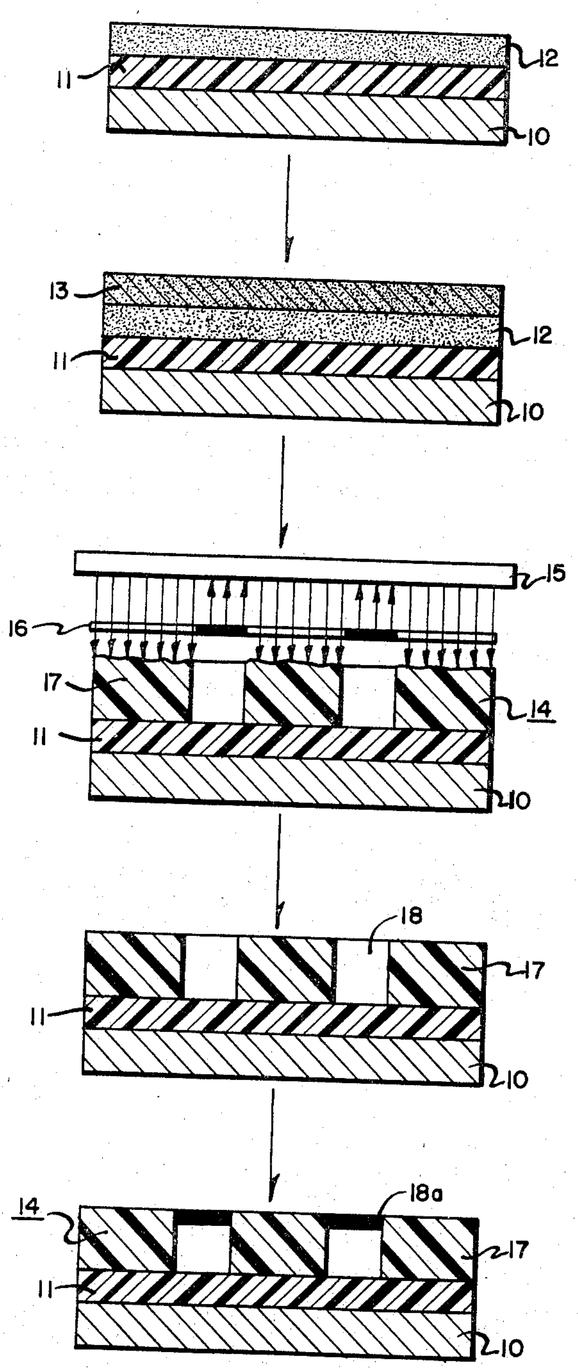
INVENTORS
DOLOR N. ADAMS
DANIEL C. THOMAS
BY
Oberlin, Maky & Donnelly
ATTORNEYS 3,373,021

PRESENSITIZED POSITIVE WORKING LITHOGRAPHIC PLATE

Dolor N. Adams, Cleveland Heights, and Daniel C. Thomas, Warrensville Heights, Ohio, assignors to Harris-Intertype Corporation, Cleveland, Ohio, a corporation of Delaware Filed Jan. 29, 1964, Ser. No. 340—929
16 Claims. (Cl. 96—33)

The present invention relates to a planographic or surface plate, and more particularly, to a presensitized positive working lithographic plate having a sensitizer including a reaction product, susceptible to coupling, of a light-sensitive diazo compound and an acidic component. The diazo reactant may be a normally negative working diazo compound.

Usually in exposing a sensitized plate, the light-exposed areas are converted to a water-insoluble, oleophilic material defining the printing areas. It is therefore necessary to use a negative of the actual pattern desired. Such a plate is accordingly termed a "negative-working" plate. It has long been desired to produce commercially a successful "positive-working" surface plate, that is, one in which the image can be formed on the plate by direct exposure to the original subject or through a suitable positive transparency of the original subject.

Previously, the usual way of preparing a positive-working surface plate has involved the use of a diazo material which in its unexposed state is oleophilic and water-insoluble but which upon exposure to light changes into a water-soluble form. In the use of such a diazo material, exposure through a positive transparency, stencil, of the like followed by aqueous development leaves the unexposed diazo on the plate to form the image or printing areas. However, after such a plate is prepared, the unexposed diazo areas which now define the printing portions of the plate are still susceptible to light exposure. Accordingly, it often happens that after the plate is in use on a press, normal room light gradually causes the ink-carrying diazo material to decompose thereby ending the useful life of the plate, particularly for high quality work.

It is, therefore, a principal object of the invention to provide a novel positive-working planographic plate.

Another object is to provide a positive-working lithographic plate which after exposure and development is no longer sensitive to light in either printing or non-printing areas.

A further object is to provide a positive-working plate in which the image or printing areas are formed of a water-insoluble, oleophilic, light-insensitive, coupled reaction product of a light-sensitive compound and an acidic component.

A still further object is to provide a method of preparing a presensitized positive-working surface plate and resulting product wherein a normally negative working diazo compound is used in forming the background or non-printing areas of the plate as well as the image or printing areas of the plate.

Other objects of the invention will become apparent as the description proceeds.

To the accomplishment of the foregoing and related ends, the invention consists of the features hereinafter fully described and particularly pointed out in the claims, the following disclosure describing in detail the invention, such disclosure illustrating, however, but one or more of the various ways in which the invention may be practiced.

The accompanying drawing diagrammatically illustrates five sequential steps or stages in the exposure and treatment of a positive working plate of the present invention.

In accordance with the present invention, a light-sensitive diazo compound reacts with a cycloaliphatic polyphosphoric acidic component to form a relatively water-insoluble reaction product. Although a chief objective of the present invention is to provide a positive working plate, one unusual result is that those light-sensitive normally negative working diazo compounds are well suited for use in the present plate. In short, a positive working surface or planographic plate may be prepared in accordance with the present invention, in one form, from a presensitized negative working surface plate by a simple overcoating process involving the use of a cycloaliphatic polyphosphoric acid.

The diazo-acidic component reaction product, although water-insoluble, is still light-sensitive and capable of undergoing a coupling reaction. Upon exposure to light, however, (such as ultra violet light) the defined reaction product becomes water-attractive rather than ink-attractive, and the ability to couple is destroyed. Coupling of the reaction product when not light exposed, on the other hand, imparts ink-attractive properties and destroys the light-sensitivity without destroying the water-insolubility. It is therefore possible through exposure of selected parts of the indicated reaction product to achieve the differential ability to attract ink or water as required for a lithographic plate and, in this case, in a positive reproduction of the pattern or transparency used. Further, since the coupling step destroys the light sensitivity in those portions so treated, these portions are prevented from becoming water-attractive and ink-rejecting under the action of light as when a plate containing the coupled reaction product is in use on a printing press.

Considering the parts of the plate in greater detail, a suitable backing or support member is employed to carry the present light-sensitive system. Such a support member for a planographic or surface plate is usually in sheet form and flexible, so that it can readily be mounted around the cylinder of a printing press.

The support member or base for the present plate may comprise coated papers such as are used in the manufacture of direct imaged plates or photo-sensitive plates. Base sheets of this type may include plates formed of paper or other sheet stock coated with an alginate, casein, carboxymethyl cellulose, or the like. A paper sheet or plate may also be suitably backed by a resin, or a paper sheet may be impregnated with a thermo-setting resin such as phenol formaldehyde. Ordinarily, however, the support member is metal-surfaced or entire sheets of metal may be used. Metals such as aluminum, zinc, copper, chromium, tin, magnesium, steel, and the like may be employed. Aluminum and zinc are preferred.

Since contact with metal chemically destroys a light-sensitive diazo material, as is known in the art, a protective layer is normally inserted between the diazo and such a metal-surfaced support member. The utility of the present plate does not depend on any particular material being used as the sub-layer. The function of the layer is, as indicated, merely to prevent direct contact of the metal with the diazo, and therefore a host of materials may constitute the interleaved protective layer or sub-layer. The sub-layer need only adhere well to the metal surface and be non-reactive with the light-sensitive system (it may react with a metal base), the present light-sensitive layer having itself adhesive properties which anchor the light-sensitive layer either to a sub-layer or other support base. In general, the preferred sub-layer as ultimately deposited is a water-insoluble, hydrophilic adhesive material that is non-reactive with the diazo material. Any material that can be used as a sub-layer for normally negative-working diazo surface plates can be used as a sub-layer in the present plate. As examples of such materials from which a sub-layer may be formed, the following are listed. Combinations of these materials may also be used to form the sub-layer. These materials are applied from a dispersion or solution, after which the liquid is removed as by evaporation.

(1) Polyacrylic acid, polymethacrylic acid, and water-soluble salts thereof such as the ammonium, potassium and sodium salts, as well as the amides such as polyacrylamide, and also the monomer of such acids, for example, acrylic acid polymerized in situ.

(2) Carboxymethyl cellulose and carboxymethyl hydroxyethyl cellulose.

(3) The aliphatic titanates having aliphatic radicals up to and including four carbon atoms, the titanates being subsequently hydrolyzed and polymerized.

(4) Modified urea-formaldehyde and melamine-formaldehyde resins as disclosed in U.S. Patents 2,715,619, 2,796,362, 2,554,475, and 2,559,578.

(5) Modified urea-formaldehyde and melamine-formaldehyde resins treated with a water-dispersible member of the class consisting of polycarboxy compounds, combined polyhydroxy polycarboxy compounds, and alkali metal silicates such as sodium, potassium and lithium silicates, and water-soluble fluo-silicates.

(6) An oxide layer of aluminum as formed by the Bauer-Vogel process.

(7) Silicates such as alkali metal silicates.

For the diazo compound or material, those compounds disclosed in U.S. Patent 3,030,210 may be used, namely, a water-soluble, high molecular weight, light-sensitive diazo compound tannable by ultra violet light. Such diazo resins are normally considered to be negative-working in the graphic arts.

A method of preparing a very satisfactory diazo compound that may be used in accordance with the present invention is described in U.S. Patent 2,679,498 and in U.S. Patent 2,100,063. This compound is a condensation product of paraformaldehyde with p-diazo-diphenylamine sulfate. Descriptions of still other diazo compounds which may be used are set forth in the following United States Patents: 2,063,631, 2,667,415, 2,692,827, 2,714,066, 2,773,779, and 2,778,735.

Additional examples of a water-soluble, high molecular weight, light-sensitive diazo compound tannable by ultra violet light which may be used include:

The condensation product of p-anilinobenenezenediazonium sulfate and formaldehyde p,p′-Iminodibenzenediazonium chloride
N-methyl-p-anilinobenzenediazonium chloride
2,5-diethoxy-4-lauramidobenzenediazonium chloride
N,N′-trimethylenebis (p-ethylaminobenzenediazonium chloride)
p,p′-Iminodibenzenediazonium chloride reacted with formaldehyde
N-benzyl-N-ethyl-p-aminobenzenediazonium chloride
N-(2,6-dichlorobenzyl)-N-ethyl-p-aminobenzenediazonium chloride
2,5-diethoxy-4-(p-ethoxyphenoxy) benzenediazonium chloride
4-(p-bromoanilino)-2,5-dibromobenzenediazonium chloride
p-(2,4,6-trichloroanilino) benzenediazonium chloride
4-anilino-3-(2,5-diethoxyphenylsulfamoyl)benzenediazonium chloride
2,5-dipropoxy-4-(p-tolylthio) benzenediazonium chloride As descrbed in the cited U.S. Patent 3,030,210, the diazo compounds, in general, possess the following characteristics:

(1) They contain light-sensitive groups contributing primarily to water solubility, that is, a diazonium group(s).

(2) The light-senstive molecule is fairly large, mainly containing at least two groups of the size of phenyl or substituted phenyl groups.

(3) The molecular fragment left when the light-sensitive group imparting water solubility has left the molecule tends to be reactive especially with molecules similar to itself so that a species of photopolymerization results.

Diazo compounds as a class meeting the aforesaid prerequisites are those of the following formulae:

$$R—Y—Ar—N_2—X$$

and $$X—N_2—Ar—R_2—Ar—N_2—X$$

wherein R is a phenyl radical such as phenyl, halophenyl, that is, bromophenyl, chlorophenyl or the like, carboxyphenyl, alkylphenyl, that is, toluyl, ethylphenyl and the like, alkoxyphenyl, that is, methoxyphenyl, ethoxyphenyl and the like, an aralkyl radical such as benzyl, chlorobenzyl, bromobenzyl and the like, cycloalkyl such as cyclohexyl or acyl, that is, acetyl, lauroyl, benzoyl and the like; Y is O, S, NH or $NR_1$, $R_1$ being alkyl, that is, methyl, ethyl, propyl or the like; Ar is an aromatic radical; X is an anion of an acid and $R_2$ is imino or polyalkylene, that is, dimethylene, trimethylene or the like.

The preferred diazo compounds are polymeric condensation products of the defined group of diazo compounds with carboxyl compounds like formaldehyde, since such condensation products ordinarily have enhanced oleophilic properties when coupled as herein described.

The acid component with which the diazo compound reacts is a cycloaliphatic polyphosphoric acid, preferably of the nature of phytic acid. The structural formula of this acid is $$C_6H_6[O-\overset{\overset{\displaystyle O}{\|}}{P}-(OH)_2]_6$$

Phytic acid, the hexaphosphoric acid ester of inositol, is a relatively strong acid containing twelve acidic groups. The reaction of the acid component with the diazo compounds is not fully understood but is believed to be a 1:1 mole ratio addition reaction between the chemically active diazo group and an acidic hydrogen group of the acid. In any event, it is possible to use partial salts and/or partial esters of phytic acid and still realize advantages of the present invention. It does not appear to be at all critical as to what other reactants block off or react with certain of the acidic hydrogen groups of the acid, as long as such reactants do not interfere with the desired reaction with the diazo group. Thus, one may use the calcium, magnesium, sodium, potassium, or ammonium partial salts of phytic acid. Or one may use an aliphatic (saturated or unsaturated) partial ester of phytic acid. Mixtures of the acid, partial salts, and partial esters (or any two of the three) may also be used. The extent of the esterification or salt formation also is not critical and depends in part on the nature of the substituent. As one test, the extent and type of esterification or salt formation is acceptable as long as the phytic acid component:

(1) Is still water-soluble, and (2) Has an acid pH.

Many coupling agents may be used to react with a coupling diazo as will be recognized by the art. As examples, the following may be listed:

Pentanedione
Resorcinol
Catechol
N-phenyl diethanolamine
N-(m-tolyl) diethanolamine
N-(m-chlorophenyl) diethanolamine
N-methyl anthranilic acid
Acetic acet-o-anisidide
Aceto acet-p-phenetidide
4-chloro-resorcinol
2,4-dinitroso resorcinol
2,3,4-trihydroxy diphenyl Diresorcyl sulfide
Resorcinol monoacetate
4-acetyl resorcinol
1-p-tolyl-3-methyl-5-pyrazolone
1-phenyl-3-methyl-5-pyrazolone
1-(4-sulfo) phenyl-3-methyl-5-pyrazolone
1-(4-sulfo) phenyl-3-carboxy-5-pyrazolone
Cyclohexylamine
Phenol
m-Cresol
Phenylhydrazine
Acetoacetanilide
Ethyl acetoacetate
Beta naphthylamine
Titanium acetylacetonate (other metal chelates, iron, nickel, magnesium, etc.)
2-hydroxy-3-naphthoyl anilide-(naphthol–AS)
2-hydroxy-3-naphthoyl-m-nitro anilide (naphthol AS–BS)
2-hydroxy-3-naphthoyl-o-toluidide (naphthol AS–D)
2-hydroxy-3-naphthoyl-p-chloro anilide (naphthol AS–E)
N,N'-bis (aceto acetyl)-o-toluidide-naphthol AS–G
2 - hydroxy-3-naphthoyl-3-chloro-4,6-dimethoxy anilide (naphthol AS–ITR)
2 - hydroxy-3-naphthoyl-5-chloro-o-toluidide (naphthol AS–TR)
2-hydroxy-3-naphthoyl-o-anisidide (naphthol AS–OL)
2-hydroxy-3-naphthoyl-o-phenetidide (naphthol AS–PH)
3 - hydroxy - 2 - benzo carbazoyl-p-methoxy-o-toluidide (naphthol AS–SR)
2-hydroxy-3-carbazoyl-4-chloro anilide (naphthol AS–LB)
2-hydroxy-3-naphthoyl-2-naphthalide (naphthol AS–SW)
2 - hydroxy - 3 - naphthoyl-2,5-dimethoxy-4-chloroanilide (naphthol AS–LG)
2-hydroxy-3-naphthoyl-1-naphthalide (naphthol AS–BO)
2 - hydroxy-3-naphthoyl-4-chloro-o-toluidide (naphthol AS–LB)
Beta oxy naphthoic acid
Beta-naphthol
3,5-ditertiary butyl catechol
2-hydroxy-3-carboxyanilido naphthalene
Trihydroxy benzene, (pyrogallol or phloroglucinol)

The couplers of the naphthol AS series are especially effective, because they increase the oleophilic nature of the coupled image areas.

GENERAL EXAMPLE 1

Referring to FIGURE 1, the relative sizes have no significance and are for purposes of illustration only. In practice, the layers are extremely thin. To prepare and use a positive working plate of the invention, the base member should be free of all foreign matter which might interfere with the deposition of a layer or layers as desired. If the base is metal-surfaced, such as an aluminum sheet 10, a sub-layer 11 of any of the materials previously mentioned may be applied from a suitable solvent, either aqueous or organic as will be apparent from the nature of the material. The solution of the sub-layer material is applied over the metal surface as by dip coating. A sufficient amount should be applied to cover completely the metal surface and provide a thickness necessary to protect a diazo compound from the aluminum sheet. Usually the sub-layer application is rinsed with water to remove any excess and then allowed to dry. Thus, the concentration of a sub-layer material in its solvent medium may range from about 0.1 percent to about 15 percent by weight or higher. Instead of dip coating, the solution or dispersion of the sub-layer material, as well as that of the subsequently applied layers, may be deposited over the plate by roller coating, whirler coating, wipe-on coating, and the like. A light-sensitive diazo layer 12 is next applied as from an aqueous solution which may contain from about 0.5 percent to about 5 percent or more by weight of the compound. After drying, the plate now corresponds to the first stage of FIGURE 1.

A solution of phytic acid, or its partial salts or esters as described, is next applied over the diazo layer or film 12. The solvent may be water or methyl alcohol or a mixture of either or both of these with ethyl or propyl alcohol, provided a sufficient amount of the water or methyl alcohol is present to maintain the phytic acid in solution (phytic acid being relatively insoluble in ethyl or propyl alcohol). Preferably, the solvent contains from about 0.2 percent to about 5 percent or more by weight of the acid component. Although the phytic acid solution is thus shown as a separate layer 13 (second stage), there is an almost immediate reaction with the light-sensitive diazo layer 12 to form a water-insoluble light-sensitive layer 14 (third stage). The rate of reaction is such that the reaction product is produced before any appreciable amount of the diazo layer is dissolved away. While a solution of phytic acid alone has been used quite satisfactorily, it is desirable under some circumstances to use one or more of the above alcohols to reduce or minimize any tendency of the solutions to dissolve the diazo. In general, loss of diazo is reduced by high concentrations of the phytic acid, higher proportions of alcohol, and lower temperatures of application.

After drying, the plate is exposed to a source 15 of ultra violet light and through a positive transparency or pattern 16. The amount of light exposure is not critical as long as there is sufficient light to decompose the diazo-phytic acid reaction product and provide hydrophilic, water attractive areas 14 (third stage) in which the coupling ability is thus destroyed.

The light-exposed layer 14 is now treated with a solution of a coupling agent. The solvent employed depends on the nature of the agent and may be either water or standard organic solvents. The fact that the diazo-phytic acid reaction product is water-insoluble permits the use of a water solution for the coupling agent when performing this step without damaging that reaction layer. Since the layer is in fact quite thin, the coupling reaction can take place even though the layer is insoluble in the water-solution of the coupler. In short, coupling takes place at the interface and/or to the extent that there is penetration of the layer without dissolving action. It should be further noted that in the present system, the diazo compound is not underlying or dispersed within a thick matrix of a water loving polymer, such as gum, which has been the case previously. The present condition affords a much more reproducible light speed.

Where organic solvents, if desired, are used for the coupling agent, such solvent may comprise alcohols, such as methyl and ethyl alcohols; aromatic solvents, such as benzene, toluene, and xylene; or dioxane; and the like. The agent couples the diazo reaction product only in the non-light-exposed portions to form ink attractive printing areas 18, the diazo reaction product in the light-exposed areas 17 having lost its coupling ability (fourth stage). Water soluble couplers such as phloroglucinol and pyrogallic acid have been successfully incorporated directly into the phytic acid (or equivalent) overcoat and positive working plates made therefrom. These plates are then coupled by treating the unexposed areas with a solution of a base which preferably also includes a wetting agent.

The plate is now desensitized using desensitizers known in the art. The desensitizers which have proved most effective have been those having a basic pH. A basic desensitizer dissolves away any residual coupling agent from the plate. As a modification, the densensitizer may be incorporated directly into the solution of the coupling agent. After rinsing the plate, it may be lacquered as at 18*a*. The plate is then ready for printing directly in light without fear of loss of the image areas 18 and 18*a* due to such further light exposure. Both the printing portions and the non-printing portions formed from the sensitized layer 14 adhere well to the underlying sub-layer or base member.

SPECIFIC EXAMPLE 2

An aluminum sheet of the type used to prepare a lithographic plate was cleaned and then treated with a water solution of a methylated methylol melamine resin. The resulting deposited coat was rinsed with water, and the assembly next heated at about 130° C. for a time sufficient to drive off the water and further cure the resin to a water-insoluble film defining a sub-layer overlying the aluminum sheet. A one percent by weight aqueous solution of a condensation product of paraformaldehyde with a p-diazo-diphenylamine sulfate (Fairmount Chemical Company's Diazo Resin No. 4) was roller coated over a sub-layer and then allowed to dry. If desired, the diazo solution may be stabilized by the addition of zinc chloride, for example, about ⅓ mol of zinc chloride per mol of diazo. The resulting diazo coat was roller coated with a one percent by weight aqueous solution of phytic acid and then air dried.

The prepared plate was next exposed through a positive transparency for 1.5 minutes at 3,000 foot candles and then swabbed for two minutes with a coupling solution having this formulation.

| Ingredient: | | Amount |
|---|---|---|
| Pentanedione | cc | 1 |
| Triaminoethane | grams | 3 |
| Deionized water | cc | 98 |

The plate was now desensitized to remove any residual coupling agent, the desensitizer having this formulation.

| Ingredient: | | Amount |
|---|---|---|
| Polyacrylic acid (25% solution) | cc | 20 |
| Water | cc | 175 |
| Ammonium molybdate | grams | 2.5 |
| Ammonium phosphate | do | 2.5 |

(Adjust pH of solution with 28% ammonium hydroxide to a pH of 8)

| | | |
|---|---|---|
| Methyl Cellosolve | cc | 0.5 |
| Triethylene glycol | cc | 1 |
| N-vinyl-2-pyrrolidone | cc | 10 |

If desired, minute amounts (up to 2 cc.'s, for example) of known wetting agents can be incorporated into the desensitizer. Finally, the plate is lacquered using, for example, a conventional black lacquer and, if desired, the plate may be gummed for storage. Plates prepared as described have been run for 35,000 copies on the press. The background of the plate remained clean throughout the test, and there was no loss of detail in the image areas.

SPECIFIC EXAMPLE 3

An aluminum sheet of sufficiently low gauge to be readily flexed was cleaned of surface grease and other contaminates by being immersed for two minutes in an aqueous solution of trisodium phosphate maintained at 160° F. Thereafter, the plate was washed for two minutes with tap water and subsequently immersed for another two minute period in a desmutting bath consisting of concentrated nitric acid (20% to 70%).

Following another two minute rinse of the plate with tap water, a protective sub-layer was applied to the working surface. The plate was first immersed for two minutes in a 0.55 percent aqueous solution of a water-soluble melamineformaldehyde condensation resin. The plate was again washed with tap water for two minutes. Although the condensation resin is water-soluble, a sufficient quantity remains (possibly due to electrostatic attraction) for subsequent operations. Next a polyacrylamide, sold under the trade name Cyanamer, and having 70 percent carboxyl groups and 30 percent amine groups was applied by dipping the plate in a 0.01 percent aqueous solution of the polymer for two minutes. After a further rinse in a water bath for two minutes, the plate was dripped for an additional two minutes in a 1.0 percent aqueous solution of zirconium acetate. The plate was once more washed for two minutes by tap water and then given a final wash with deionized water and dried. The foregoing applied an impervious sub-layer over the alumium sheet.

Next, the plate prepared as described was immersed in a 0.5 percent aqueous solution of a condensation product of parafiormaldehyde with p-diazo-diphenylamine sulfate and then passed between rollers and dried. An alcoholic solution of 0.2 percent phytic acid was next whirler coated over the diazo coat and dried. The alcohol of such solution consisted of 10 percent methyl alcohol and 90 percent ethyl alcohol. There was an immediate reaction between the diazo and phytic acid films or coats.

The plate was next exposed through a positive transparency for 1.5 minutes at 3,000 foot-candles. The plate was next washed with the coupling agent of Example 2, although the following coupling agent could have been used as well:

| Ingredient: | Parts by volume |
|---|---|
| Ethanolamine, 0.5% solution of zirconium tetra-2,4-pentadionate in dimethyl | 1 |
| Formamide | 1 |
| Ethanol | 87 |

A wash with tap water was then carried out over the plate in order to remove most of the unused excess coupler. After desensitizing and then inking the plate with known compounds and inks for this purpose, the plate was ready for the press.

In the foregoing examples, known equivalent materials such as those disclosed herein may be substituted for those stated in the example. The times and temperatures and other parameters being adjusted where and if needed as easily determined by trial and error. The patents cited herein are hereby incorporated by reference.

Other forms embodying the features of the invention may be employed, change being made as regards the features herein disclosed, provided those stated by any of the following claims or the equivalent of such features be employed.

We therefore particularly point out and distinctly claim as our invention:

1. A lithographic plate comprising a support member, and a light-sensitive layer overlying the support member comprising the reaction product of a light-sensitive diazo resin and a cycloaliphatic polyphosphoric acid.

2. The lithographic plate of claim 1 wherein said cycloaliphatic polyphosphoric acid is phytic acid.

3. A positive-working lithographic plate comprising a support member, and a light-sensitive layer overlying a surface of the support member adapted for subsequent exposure and development, said layer comprising the reaction product of a light-sensitive diazo resin and a reactant selected from the group consisting of phytic acid, the water-soluble acidic partial esters of phytic acid, and mixtures thereof.

4. The positive-working lithographic plate of claim 3 wherein said light-sensitive diazo resin is tannable by ultra violet light and consists essentially of a polymeric condensation product of formaldehyde with a water-soluble, high molecular weight, light-sensitive diazo compound.

5. A lithographic plate comprising a support member, and a light-sensitive layer overlying said support member comprising the reaction product of a light-sensitive diazo resin and a cycloaliphatic polyphosphoric acid, said light-sensitive diazo resin being the condensation product of a diazo compound and a carboxyl containing compound.

6. The lithographic plate of claim 3 wherein said diazo compound consists essentially of a condensation product of paraformaldehyde with a p-diazo-diphenylamine sulfate.

7. In a presensitized, positive-working lithographic plate comprising a metal-surfaced support member, a light-sensitive diazo compound-containing layer, and a protective layer interposed between the metal surface and the light-sensitive layer to prevent direct contact between the metal and the diazo compound; the improvement characterized by providing as said light-sensitive layer a light-sensitive reaction product of a light-sensitive diazo resin and a reactant selected from the group consisting of phytic acid, the water-soluble acidic partial salts of phytic acid, the water-soluble acidic partial esters of phytic acid, and mixtures thereof.

8. A presensitized, positive-working lithographic plate comprising an aluminum sheet, a water-insoluble hydrophilic cover over said sheet protecting the sheet from reaction with a diazo compound, and a light-sensitive layer overlying the cover, said layer consisting essentially of a stratum of a light-sensitive diazo resin over said protective cover reacted in situ with phytic acid.

9. A method of preparing a presensitized, positive-working lithographic plate comprising applying to a support member non-reactive therewith a layer of a light-sensitive diazo resin, applying over the layer a film of an acidic component, which enables the component to react with the diazo resin in situ to provide a water-insoluble lithographic light-sensitive layer, said acidic component being selected from the group consisting of phytic acid, the water-soluble acidic partial salts of phytic acid, the water-soluble acidic partial esters of phytic acid, and mixtures thereof.

10. A method of preparing a diazo-presentitized, positive-working lithographic plate comprising forming on a metal surfaced support member adapted to define the backing of the plate a water-insoluble protective covering to prevent direct contact between the metal and a light-sensitive diazo resin, applying over the protective covering from solution a coat of a light-sensitive diazo resin and drying, and applying over the light-sensitive diazo coat from solution an acidic component selected from the group consisting of phytic acid, the water-soluble acidic partial salts of phytic acid, the water-soluble acidic partial esters of phytic acid, and mixtures thereof, said light-sensitive diazo resin and acidic component combining to form the sensitized layer of the plate.

11. A method of preparing a presensitized, positive-working lithographic plate comprising treating a normally negative-working diazo-sensitized lithographic plate with an acidic reactant selected from the group consisting of phytic acid, the water-soluble acidic partial salts of phytic acid, the water-soluble acidic partial esters of phytic acid, and mixtures thereof.

12. A method of preparing a lithographic printing plate comprising forming on a support member adapted to define the backing of the plate a layer comprising the reaction product of a light-sensitive diazo resin and a cycloaliphatic polyphosphoric acid, said layer being non-reactive with the support member, exposing selected portions of the light-sensitive layer to light to convert said portions to non-ink-attractive areas of the plate, and thereafter treating said layer with a coupling agent to convert the non-selected portions to ink-attractive areas of the plate.

13. A method of preparing a lithographic printing plate comprising applying to a support member non-reactive therewith a layer of a light-sensitive diazo resin, applying over the layer a film of an acidic component, which enables the diazo resin to react with the acidic component in situ to form a water-insoluble lithographic light-sensitive layer, said acidic component being selected from the group consisting of phytic acid, the water-soluble acidic partial salts of phytic acid, the water-soluble acidic partial of phytic acid, and mixtures thereof, exposing selected portions of the light-sensitive layer to light to form hydrophilic areas adapted to define non-printing areas of the plate, and treating the light-exposed plate with a diazo coupling agent to couple the diazo-acid component reaction product in the non-selected portions to form ink-attractive areas adapted to define the printing areas of the plate, and then desensitizing the non-printing areas.

14. A method of preparing a positive working printing plate adapted for continuous use in light without loss of image areas due to such light comprising applying to a metal-surfaced support member adapted to define the backing of the plate a water-insoluble protective covering to prevent direct contact between the metal and a light-sensitive diazo resin, forming over the protective covering from solution a coat of a normally negative-working light-sensitive diazo resin and drying, and applying over the light-sensitive diazo coat from solution an acidic component selected from the group consisting of phytic acid, the water-soluble acidic partial salts of phytic acid, the water-soluble acidic partial esters of phytic acid, and mixtures thereof, which enables said diazo compound and acidic component to react and to form a water-insoluble light-sensitive coupleable layer, exposing selected portions of the light-sensitive layer to light to destroy the coupling ability of the diazo-acidic component reaction product in such portions and form hydrophilic areas adapted to define non-printing areas of the plate, treating the light exposed plate with a diazo coupling agent to couple the diazo-acidic component reaction product in the non-selected portions to destroy the light-sensitivity thereof and form ink-attractive areas adapted to define the printing areas of the plate, desensitizing the non-printing areas, and lacquering the printing areas to intensity the oleophilic nature thereof.

15. In an image-bearing lithographic plate adapted for printing, ink-receptive image areas comprising the coupled reaction product of a light-sensitive diazo resin and an acidic component selected from the group consisting of phytic acid, the water-soluble acidic partial salts of phytic acid, the water-soluble acidic partial esters of phytic acid, and mixtures thereof, and water-receptive non-image areas comprising the light-radiated reaction product of a light-sensitive diazo resin and said acidic component.

16. In an image-bearing lithographic plate adapted for printing, ink-receptive image areas comprising the coupled reaction product of a light-sensitive diazo resin and an acidic component selected from the group consisting of phytic acid, the water-soluble acidic partial salts of phytic acid, the water-soluble acidic partial esters of phytic acid, and mixtures thereof, and water-receptive non-image areas.

References Cited

UNITED STATES PATENTS

| | | | |
|---|---|---|---|
| 3,307,951 | 3/1967 | Adams et al. | 96—33 X |
| 2,063,631 | 12/1936 | Schmidt et al. | 96—91 XR |
| 2,667,415 | 1/1954 | Neugebauer et al. | 96—33 |
| 3,113,023 | 12/1963 | Mellan | 96—33 |

NORMAN G. TOCHIN, *Primary Examiner.*

C. L. BOWERS, *Assistant Examiner.*